United States Patent
Norton (10) Patent No.: US 6,214,712 B1
(45) Date of Patent: Apr. 10, 2001

(54) METHOD OF PHYSICAL VAPOR DEPOSITION OF METAL OXIDES ON SEMICONDUCTORS

(75) Inventor: David P. Norton, Knoxville, TN (US)

(73) Assignee: UT-Battelle, LLC, Oak Ridge, TN (US)

(*) Notice: Subject to any disclaimer, the term of this patent is extended or adjusted under 35 U.S.C. 154(b) by 0 days.

(21) Appl. No.: 09/397,719

(22) Filed: Sep. 16, 1999

(51) Int. Cl.$^7$ .............. H01L 21/3205; H01L 29/30; H01L 21/31; C23C 14/28; C30B 29/52

(52) U.S. Cl. .............. 438/591; 427/595; 427/596; 117/105; 117/938; 148/33; 438/785

(58) Field of Search .............. 438/2, 591; 427/255.19, 427/595, 596; 117/105, 939, 949; 428/471; 148/DIG. 6, 33

(56) References Cited

U.S. PATENT DOCUMENTS

| | | | |
|---|---|---|---|
| 3,672,992 | * 6/1972 | Schaffer | 117/219 |
| 4,159,919 | * 7/1979 | McFee et al. | 148/175 |
| 5,225,031 | 7/1993 | McKee et al. | |
| 5,274,249 | * 12/1993 | Xi et al. | 257/39 |
| 5,347,157 | * 9/1994 | Hung et al. | 257/627 |
| 5,387,459 | * 2/1995 | Hung | 428/209 |
| 5,547,922 | * 8/1996 | Ma | 505/325 |
| 5,731,049 | * 3/1998 | Taihades et al. | 427/597 |
| 5,795,848 | * 8/1998 | Ma | 505/162 |
| 5,817,531 | * 10/1998 | Nakamura et al. | 438/2 |
| 5,834,803 | * 11/1998 | Nashimoto | 257/295 |

OTHER PUBLICATIONS

K.M. Horn et al, "Oxygen Roughening of Ge (001) Surfaces", Surface Science 320, 174–184 (1994).

L. Surnev et al, "Oxygen Adsorption on a Ge(100) Surface", Surface Science 123, 505–518 (1982).

K.J. Hubbard et al, "Thermodynamic Stability of Binary Oxides in Contact with Silicon", J.Mater.Res. 11, 2757–2776 (1996).

R.A. McKee et al, "Crystalline Oxides on Silicon: The First Five Monolayers", Physics Review Letters, vol. 81, 3014–3017 (1998).

(List continued on next page.)

*Primary Examiner*—Olik Chaudhuri
*Assistant Examiner*—Shrinivas H. Rao
(74) *Attorney, Agent, or Firm*—Michael E. McKee; George L. Craig; Joseph A. Marasco (57) ABSTRACT

A process for growing a metal oxide thin film upon a semiconductor surface with a physical vapor deposition technique in a high-vacuum environment and a structure formed with the process involves the steps of heating the semiconductor surface and introducing hydrogen gas into the high-vacuum environment to develop conditions at the semiconductor surface which are favorable for growing the desired metal oxide upon the semiconductor surface yet is unfavorable for the formation of any native oxides upon the semiconductor. More specifically, the temperature of the semiconductor surface and the ratio of hydrogen partial pressure to water pressure within the vacuum environment are high enough to render the formation of native oxides on the semiconductor surface thermodynamically unstable yet are not so high that the formation of the desired metal oxide on the semiconductor surface is thermodynamically unstable. Having established these conditions, constituent atoms of the metal oxide to be deposited upon the semiconductor surface are directed toward the surface of the semiconductor by a physical vapor deposition technique so that the atoms come to rest upon the semiconductor surface as a thin film of metal oxide with no native oxide at the semiconductor surface/thin film interface. An example of a structure formed by this method includes an epitaxial thin film of (001)-oriented $CeO_2$ overlying a substrate of (001) Ge.

21 Claims, 7 Drawing Sheets

OTHER PUBLICATIONS

S.H. Jang et al, "Properties of $CeO_2$ Thin Flims Deposited on Si(100) and Si (111) Substrates by Radio Frequency–Magnetron Sputtering", J.Vac. Sci. Technology B 16, 1098–1101 (1988).

H. Koinuma et al, "Ceramic Layer Epitaxy by Pulsed Laser Deposition in an Ultrahigh Vacuum System", Applied Physics Letters, vol. 58, 2027–2029 (1991).

T. Inoue et al, "Growth of (110)–oriented $CeO_2$ Layers on (100) Silicon Substrates", Applied Physics Letters, vol. 59, 3604–3606 (1991).

D.P. Norton et al, "Epitaxial $Yba_2Cu_3O_7$ on Biaxially Textured Nickel (001): An Approach to Superconducting Tapes with High Critical Current Density", Science, vol. 274, 755–757 (1996).

M. Paranthaman et al, "Growth of Biaxially Textured Buffer Layers on Rolled–Ni Substrates by Electron Beam Evaporation", Physica C 275, 266–272 (1997).

* cited by examiner

METHOD OF PHYSICAL VAPOR DEPOSITION OF METAL OXIDES ON SEMICONDUCTORS

This invention was made with Government support under Contract No. DE-AC05-96OR22464 awarded by the U.S. Department of Energy to Lockheed Martin Energy Research Corporation, and the Government has certain rights in the invention.

BACKGROUND OF THE INVENTION

This invention relates generally to the construction of thin films onto semiconductor surfaces and relates, more particularly, to the construction of a thin-film build-up onto semiconductor surfaces utilizing physical vapor deposition techniques.

Heretofore, much of the success of silicon metal-oxide-semiconductor (MOS) structures in microprocessor and memory technologies has been largely dependent upon the formation of well-defined $SiO_2$-on-silicon (abbreviated $SiO_2$/Si) structures wherein $SiO_2$ serves as the gate oxide. However, for silicon MOS devices, including silicon metal-oxide-semiconductor field effect transistor (MOSFET) devices, there is considerable interest in replacing $SiO_2$ with a deposited dielectric material possessing a higher dielectric constant. Furthermore, semiconductor materials—other than those which include silicon—are likely to become attractive for use in digital switching applications if methods are developed for forming well-defined oxide/semiconductor interfaces suitable for functional MOS-type structures. For example, Ge is an attractive semiconductor material for microelectronic applications because Ge possesses higher carrier mobility and a higher thermal conductivity than that of silicon. However, the native germanium oxides are not suitable for MOS-type device structures because these oxides are not very stable. With this in mind, the formation of stable metal oxides on Ge could prove instrumental in the development of Ge surfaces, as well as other non-silicon-including semiconductor surfaces, for use in integrated circuit applications.

For the development of MOS devices which employ a thin-film oxide disposed directly atop a semiconductor material other than silicon for use in applications, such as can include sensor, photovoltaic and optoelectronic applications, the formation of well-defined metal oxide/semiconductor interfaces is of paramount importance. Within the structure of many of such devices, it is preferable that the metal oxide/semiconductor interface be devoid of any native oxide, since the presence of native oxide at the interface is likely to limit the performance of these structures. Accordingly, it would be desirable to provide a method for constructing a thin-film build-up of metal oxide onto a semiconductor surface, other than a surface which includes silicon, wherein the growth of native oxides at the surface/metal oxide interface is minimized. By definition, a native oxide is that oxide (or oxides) which spontaneously forms on the material surface when the material surface is exposed to oxygen at elevated temperatures.

Accordingly, it is an object of the present invention to provide a new and improved method for growing thin-film metal oxide upon a semiconductor surface, other than a surface which includes silicon, which reduces the likelihood that native oxides will form at the surface/oxide interface and structures formed with the method.

Another object of the present invention is to provide such a method which utilizes physical vapor deposition techniques.

Still another object of the present invention is to provide such a method for growing a thin-film metal oxide upon the underlying semiconductor surface wherein the thin-film growth can be used as a template for additional film growth.

Yet another object of the present invention is to provide such a method which is uncomplicated to perform.

SUMMARY OF THE INVENTION

This invention resides in a method for growing a metal oxide thin film upon the surface of a semiconductor with a physical vapor deposition technique wherein constituent atoms of the metal oxide to be deposited upon the semiconductor surface are moved toward the semiconductor surface in a controlled environment and a structure formed with the method.

The process of the invention includes the steps of developing an ultra-high vacuum environment about a semiconductor surface which has been cleaned to atomic cleanliness and wherein the primary vapor constituent of the high-vacuum environment is water. Then the semiconductor surface is heated to an elevated temperature, and hydrogen gas is introduced into the high-vacuum environment so that the surface temperature and the ratio of hydrogen partial pressure to water partial pressure at the semiconductor surface are high enough to render the formation of native oxides on the semiconductor surface thermodynamically unstable yet are not so high that the formation of the desired metal oxide on the semiconductor surface is thermodynamically unstable. With the aforedescribed elevated temperature and the ratio of hydrogen partial pressure to water partial pressure having been established, constituent atoms of the metal oxide to be deposited upon the semiconductor surface are directed toward the semiconductor surface by a physical vapor deposition technique so that the atoms come to rest upon the semiconductor surface as a thin film of metal oxide so that there exists substantially no native oxide at the semiconductor surface/thin film interface.

The use of hydrogen background gas reduces or eliminates the formation of native oxides during the deposition of a metal oxide layer on a semiconductor surface and leads to a reduction in required temperatures and a relaxation of the background pressure requirements necessary to eliminate the native oxide and achieve growth (including epitaxial growth) of oxides on a single crystal semiconductor surface. Without the use of a hydrogen background gas, a high-temperature annealing in UHV conditions would be necessary in order to desorb the native oxide and achieve epitaxy. The decomposition of a given oxide by hydrogen is determined by the thermodynamic Gibbs free energy of the oxide.

Further still, the invention can be used to construct a distinct article, namely an epitaxial (001) $CeO_2$ film on (001) Ge, which has not been realized by any other technique. It also provides a route to forming a structure including epitaxial (001) $CeO_2$ film on a Si substrate (wherein a layer of Ge is interposed between the Si substrate and the $CeO_2$ film) which has not been achieved heretofore.

Structures constructed with the method of the invention can be used for numerous electronic and optoelectronic devices, including metal-oxide-semiconductor field-effect transistors, random-access memory devices, and optical waveguide structures.

DETAILED DESCRIPTION OF THE ILLUSTRATIVE EMBODIMENTS

Figures 1, 2:
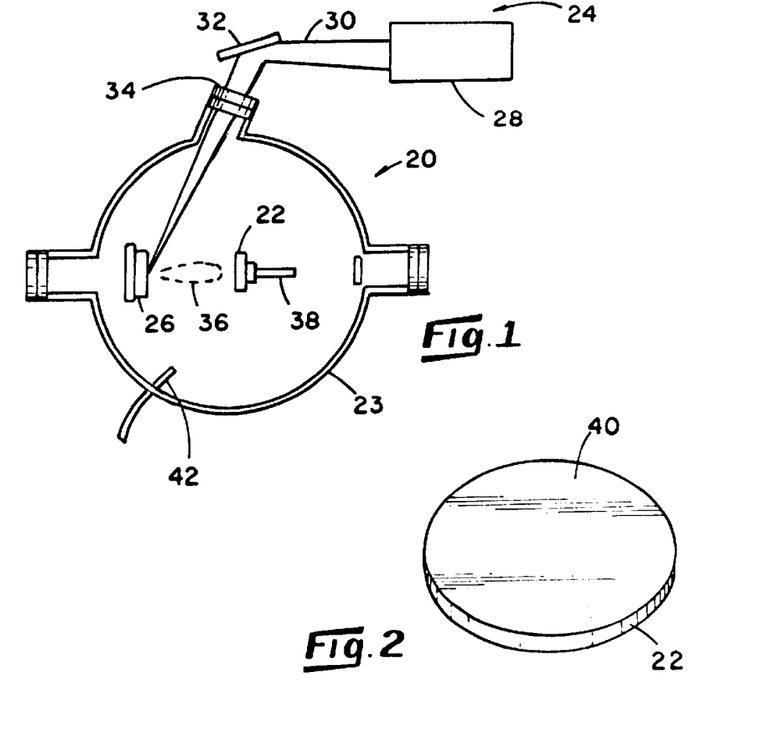
FIG. 1 is a schematic cross-sectional view of a pulsed-laser deposition film growth chamber within which the method of the invention can be carried out.
FIG. 2 is a perspective view of a semiconductor-based substrate upon which a metal oxide film is desired to be deposited.

Turning now to the drawings in greater detail, there is schematically shown in FIG. 1 a film growth chamber 20 within which a thin film of metal oxide is deposited upon the surface of a semiconductor-based substrate 22 (wherein the substrate surface is provided by a surface other than a silicon-including material), in accordance with the method of the present invention. The growth chamber 20 includes an ultra-high vacuum facility 23 within which the substrate 22 is positioned while the metal oxide thin film is grown thereon and is capable of creating an ultra-high vacuum environment about the substrate 22. For purposes of growing the metal oxide thin film upon the substrate 22, there is associated with the chamber 20 pulsed laser ablation equipment, generally indicated 24, for ablating constituent atoms from a target 26 so that the ablated atoms come to rest upon the surface of the substrate 22. As will be apparent herein, the atoms which are ablated from the target 26 are the atoms which comprise the thin film of metal oxide built up upon the surface of the substrate 22.

Although the exemplary method described herein with the film growth chamber 20 involves pulsed laser deposition, other techniques of physical vapor deposition, such as thermal or e-beam evaporation, sputtering or other techniques in which the depositing material is delivered to the substrate 22 in a vapor flux, can be employed. Accordingly, the principles of the present invention can be variously applied.

The components and operation of the pulsed laser ablation equipment 24 are well known so that a detailed description of such components and operation is not believed to be necessary. Briefly, however, the equipment 24 includes a laser 28 for directing a laser beam 30 along a path (along which a scanning mirror 32 and lens 34 are positioned) toward the target 26 which is mounted in a stationary condition within the facility 23. During operation, the laser beam 30 ablates constituent atoms from the surface of the target 26 in a vapor plume 36, and the atoms of the plume 36 move toward and come to rest upon the surface of the substrate 22. The substrate 22 is mounted in a fixed position within the facility 23 so that the substrate surface upon which the atoms are to be deposited generally faces (and lies in the path of) the vapor plume 36 of atoms. For purposes of heating the substrate 22, there is supported adjacent the substrate 22 an electric resistance heater 38.

With reference to FIG. 2, there is shown an example of a substrate 22 having a surface 40 upon which a thin film of metal oxide can be built in accordance with the steps of the present invention. The surface 40 of the depicted substrate 22 is germanium (Ge). However, in accordance with the principles of the present invention (and in accordance with the oxide stability levels discussed herein) the semiconductor surface 40 must be provided by, or comprised of, a material or a combination of materials from a group consisting of: In, Sn, P, Mo, Sb, As, Bi, Pb, Te, Se, W, Ge, Cd, Ni, Fe, Co, Cu, Ag, Pt, Hg, Ir, Os, S, Ga, K, Zn, Na, Nb, Mn, Ta, Cr and V known to provide, or comprise, (either alone or in combination with another element) a semiconductor surface. These combinations can include, for example, InP, InAs, PbSe, CdTe, and $CuInSe_2$. It is noteworthy that the foregoing list is comprised of Group III-V, Group II-VI and Group I-III-VI semiconductor materials.

The surface 40 of the substrate 22 has been cleaned to atomic cleanliness by known cleaning techniques. For example, the substrate surface 40 can be cleaned by successive rinsing in trichloroethylene, acetone, and methanol, followed by rinsing in a deionized water. Any native oxide which is thereafter present on the surface 40 can be removed by a thirty-second dipping in a 1:10 $HF:H_2O$ solution. To dry the substrate surface 40, dry nitrogen can be blown over the surface 40. Alternative schemes for cleaning the surface 40 to atomic cleanliness commonly involve the cleaning of the surface with appropriate solvents and thereafter etching any native oxide from the surface 40.

As mentioned earlier, the target 26 (FIG. 1) includes constituents of the metal oxide desired to be grown upon the substrate surface 40. Consequently, the material of the target 26 is comprised of atoms of oxygen and the metal of the desired metal oxide to be deposited upon the surface 40. Examples of the target material can be an oxide ceramic which is adapted to release atoms from the surface thereof in a flux when the target surface is struck with the laser beam 30. Specific metal oxide compounds suitable for use as a target material (for subsequent build up as the desired metal oxide thin film upon the substrate surface 40) include $La_2O_3$, BaO, MgO, CaO, $Al_2O_3$, $HfO_2$, $ZrO_2$, $CeO_2$, $Ce_2O_3$, $Sc_2O_3$ and $Y_2O_3$.

During a laser ablation operation performed upon the target 26, the metal cations and the oxygen atoms comprising the target are ablated from the target 26 by short decreet pulses of the laser beam 30. With regard to the environmental conditions (e.g. substrate temperature, water vapor partial pressure or hydrogen partial pressure) at the substrate surface 40, the metal oxide deposited upon the substrate surface 40 must be thermodynamically stable when the constituent atoms thereof come to rest upon the substrate whereas the native oxide must not be thermodynamically stable if formed upon the substrate. Along these lines and as will be apparent herein, the conditions of the facility environment surrounding the substrate are established with regard to the target material.

With the substrate surface 40 in an atomically-clean condition, the substrate 22 is mounted within the chamber 20, and an ultra-high vacuum is drawn within the facility 23 to create a high-vacuum (base-pressure) environment about the substrate 22. In particular, the facility 23 is evacuated to a base pressure sufficiently low to achieve a hydrogen-to-water partial pressure ratio [abbreviated $P(H_2)/P(H_2O)$ ratio] for native oxide decomposition. As will be described in exemplary methods herein, for physical vapor deposition of a metal oxide on a Ge substrate, the base pressure to which the facility 23 is evacuated is below about $10^{-3}$ Torr (and preferably below about $10^{-5}$ Torr). By comparison, for physical deposition of a metal oxide on a substrate of GaAs, the base pressure to which the facility 23 is evacuated is below about $10^{-6}$ Torr (and preferably below about $10^{-8}$ Torr). Commonly, the base pressure of the facility 23 can be considered to be an approximate estimate for $P(H_2O)$ because the primary vapor constituent of the high-vacuum environment, when established, is water.

The base pressure requirements for the method of the present invention are much less stringent than that for conventional approaches that rely on thermal desorption of the native oxides prior to film growth. This represents a significant advantage in terms of vacuum system requirements for growing such structures. In addition, the hydrogen-assisted approach described herein generally lends itself to processing temperatures that are less than what would be required for conventional ultra-high vacuum oxide desorption.

Upon evacuation of the facility 23 to the desired base pressure (i.e. the vacuum pressure achieved in the facility prior to the initiation of hydrogen introduction into the facility), the temperature of the substrate 22 is raised to an elevated condition (by way of the heater 38) and hydrogen is introduced into the facility 23 (by way of a port 42 permitting the introduction of a background gas) to establish a desired hydrogen partial pressure (or, more specifically, a desired ratio of hydrogen partial pressure to water partial pressure) within the facility 23. The purpose served by heating the substrate 22 and developing a hydrogen partial pressure within the facility 23 is to create conditions at the substrate surface 40 so that native oxides which could form on the substrate surface 40 are thermodynamically unstable (and will thus decompose) while the chosen metal oxide to be built up upon the substrate surface is thermodynamically stable. In other words, the substrate temperature and the amount of hydrogen gas present at the substrate surface 40 is controlled to reduce or eliminate the presence of the semiconductor native oxides from the semiconductor surface during the initial nucleation of the metal oxide film using physical vapor deposition. The result of such a build up is that there exists no native oxide at the substrate/thin-film interface so that the interface is relatively sharp. For present purposes, the term "metal oxide" is used in connection with the composition of the thin-film build up upon the substrate surface, while the term "native oxide" is used to describe the unwanted oxide (such as $GeO_2$) which could naturally form on the substrate surface in the presence of oxygen.

The conditions at the substrate surface at which the native oxides are thermodynamically unstable can be determined with regard to the temperature-dependent Gibbs free energy of the native oxide when compared to the $H_2O/H_2$ equilibrium behavior. Basically, in order to achieve elimination of the semiconductor native oxides, the hydrogen partial pressure and substrate temperature must be sufficiently high such that the native oxides are thermodynamically unstable. In this connection, I have derived (from Ellingham diagrams for oxide materials) oxide stability lines for a number of oxides of interest as a function of temperature and ratio of the hydrogen partial pressure to the water partial pressure and provided such stability lines in FIGS. 3–11. At conditions corresponding to points in a graph above these lines, the native oxides are thermodynamically unstable and will decompose, while at conditions corresponding to graph points below these lines, the native oxides are thermodynamically stable.

Practical limits for the environmental conditions within the facility chamber 23 are determined by the operational pressure range of the physical vapor deposition technique, the purity of the hydrogen, and the decomposition or melting temperature of the semiconductor. For example, for e-beam and thermal evaporation, an upper limit on total pressure is typically $10^{-4}$ Torr. By comparison, sputtering can be performed with a pressure ranging from $10^{-4}$ to several Torr. Pulsed-laser deposition is more versatile, capable of deposition pressures ranging from UHV ($10^{-11}$) to several Torr. Pulsed-laser deposition also has the advantage of providing the depositing material flux, including oxygen, as short bursts. Between pulses, the substrate surface can return to near-equilibrium conditions for the decomposition of the native oxide (or oxides). Hydrogen gas with water vapor contamination less than one part per million can be easily obtained, indicating that $P(H_2)/P(H_2O)$ ratios as high as $10^6$ are feasible. For a base pressure of $10^{-7}$ Torr, this requires a hydrogen partial pressure of at least $10^{-1}$ Torr. Of course, the selected temperature must be below either the decomposition or melting temperature of the semiconductor substrate.

The upper limit on the base pressure is determined by the stability of the native oxide (or oxides) and the operating pressure of the vapor deposition technique. For example, in pulsed-laser deposition operating at a hydrogen partial pressure of 0.1 Torr, a base pressure of $10^{-2}$ Torr is suitable for oxide deposition on CdTe. For an operating pressure of $10^{-3}$ Torr, this criterion is met with a vacuum base pressure of $10^{-4}$ Torr. For an operating pressure of $10^{-5}$ Torr, the base pressure requirement is satisfied at a base 10 pressure of $10^{-6}$ Torr. For an operating pressure of $10^{-7}$ Torr, the criterion is met with a vacuum base pressure of $10^{-8}$ Torr.

In addition to the requirement that conditions at the substrate surface be such that the formation of native oxide is thermodynamically unstable, the Gibbs free energy of the chosen metal oxide film must be larger in magnitude than that of the semiconductor native oxide in order for it to be more favorable for the metal oxide to reside at the interface in comparison to the native oxide(s). Again, oxide stability lines (derived from Ellingham diagrams for oxide materials) for the metal oxide film being deposited upon the substrate provide guidance regarding the appropriate conditions for the deposition process. Accordingly, I have plotted in FIGS. 9 and 10 the oxide stability lines for several technologically-useful binary oxides, and in particular $La_2O_3$, BaO, MgO, CaO, $Al_2O_3$, $HfO_2$, $ZrO_2$, $CeO_2$, $Ce_2O_3$, $Sc_2O_3$ and $Y_2O_3$. For metal oxide/semiconductor systems with favorable (i.e. relatively close) lattice-matching, this invention will enable epitaxy of a metal oxide on the semiconductor surface.

This approach is generally applicable for many semiconductor substrate materials, other than silicon-including materials, and has a significant advantage over conventional physical vapor deposition approaches in that it relaxes the vacuum requirements necessary to achieve a sharp interface between the metal oxide film and the semiconductor.

In the case of the semiconductor material silicon, the hydrogen partial pressure would have to be so high (to render the native oxide $SiO_2$ unstable) that the physical vapor deposition procedure in the facility chamber 23 would not be successful. Hence, this approach is not applicable for pure silicon surfaces.

Figure 11:
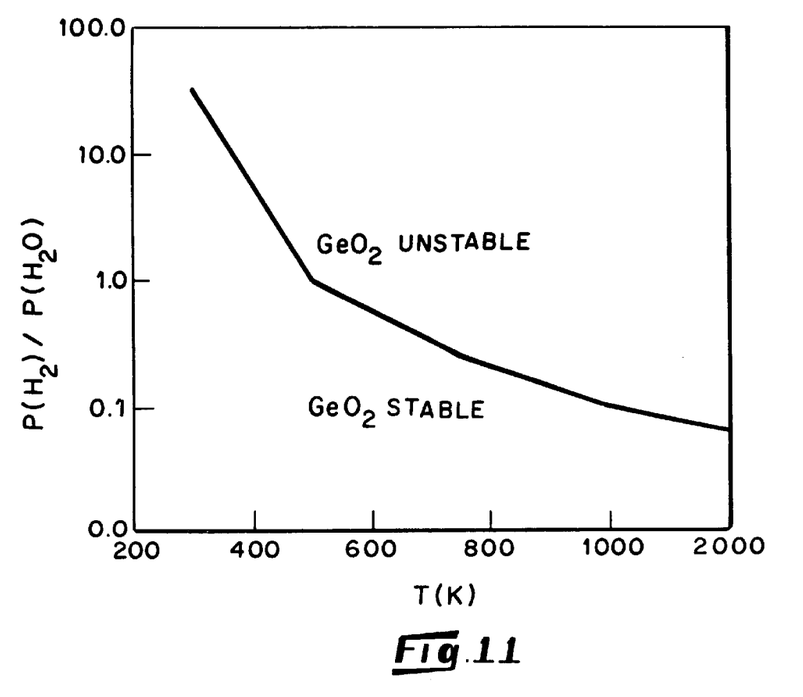
FIG. 11 is a graph on which is plotted stability lines for the native oxide $GeO_2$.

For illustrative purposes, there is provided in FIG. 11 a plot of $P(H_2)/P(H_2O)$ versus temperature illustrating a stability line delineating the conditions at which the formation of the native oxide $GeO_2$ upon a Ge substrate is either thermodynamically stable or is thermodynamically unstable. For example, at a substrate temperature of 600° K. and a $P(H_2)/P(H_2O)$ ratio of 0.1, $GeO_2$ is stable while at a substrate temperature of 1000° K. and a $P(H_2)/P(H_2O)$ ratio of 1.0, $GeO_2$ is unstable. Consequently, and in order that $GeO_2$ is unstable during a physical vapor deposition procedure on a Ge substrate, the temperature of the substrate and the hydrogen partial pressure, or more specifically, the $P(H_2)/P(H_2O)$ ratio, is selected to provide conditions within the facility 23 at which the $GeO_2$ is thermodynamically unstable.

While regard is given to the conditions at which the native oxide is thermodynamically unstable, regard must similarly be given to the conditions at which the metal oxide is thermodynamically stable when forming upon the substrate surface. In other words, there exists parameters (again, as a function of the Gibbs free energy) attending the metal oxide desired to be deposited upon the substrate at which the metal oxide is stable when coming to rest upon the substrate surface and parameters attending the metal oxide at which the metal oxide is unstable when coming to rest upon the substrate surface; and care should be taken to ensure that the conditions at the substrate surface are favorable to the growth of the metal oxide desired to be grown upon the substrate surface.

It follows from the foregoing that in order for a selected metal oxide moving toward the substrate surface in a vapor flux to stably form upon the substrate surface under conditions which are unfavorable to the formation of native oxides upon the substrate, regard must be given to the stability lines of both the native oxide(s) which could form upon the substrate and the metal oxide desired to be grown upon the substrate. In other words, the temperature and $P(H_2)/P(H_2O)$ ratio at the substrate surface must be selected so that the growth of the chosen metal oxide upon the substrate surface must be favorable (and hence rendered stable when formed) and so that the growth of any native oxide upon the substrate surface is unfavorable (and hence unstable if formed on the substrate). During the heating of the substrate, it may be advantageous to initially heat the substrate to a temperature slightly greater than the target deposition temperature in order to accelerate the decomposition of the native oxide. The dwell time at this higher-than-target temperature is determined by the kinetics of native oxide decomposition.

Preferably, the metal oxide film is nucleated at a value of $P(H_2)/P(H_2O)$ that is at least an order of magnitude above the oxide stability line for the native oxide. It will be understood, however, that in accordance with the broader aspects of this invention, the nucleation need only occur above the oxide stability line for the native oxide. For the practical limit of $P(H_2)/P(H_2O) \leq 10^6$, the preferred criteria is possible for a number of substrate surfaces that comprise combinations of the following elements: In, Sn, P, Mo, Sb, As, Bi, Pb, Te, Se, W, Ge, Cd, Ni, Fe, Co, Cu, Ag, Pt, Hg, Ir, Os, and S. Note that this criteria is satisfied for a number of technologically-important semiconductors, including InP, InAs, PbSe, CdTe, and $CuInSe_2$. Relaxing the preferred criteria to include all elements that satisfy the native oxide instability requirement for $P(H_2)/P(H_2O) \leq 10^6$ adds to this list of elements Ga, K, Zn, Na, Nb, Mn, Ta, Cr and V. This criterion is then satisfied for additional important semiconductors, including GaAs, GaP, and ZnS. Note that Si is not included in these lists for reasons mentioned earlier, and that Na, Nb, Mn, Ta, Cr, and V only marginally satisfy the minimal requirements at elevated temperatures.

Once the selected $P(H_2)/P(H_2O)$ ratio is established within the interior of the facility 23 and the temperature of the substrate 22 is raised to the desired temperature level, metal and oxygen atoms are ablated from the surface of the target with the laser beam 30 and move toward the substrate surface in a vapor plume. The initial nucleation of at least the first monolayer of the metal oxide film must be carried out at the selected elevated target temperature and $P(H_2)$. If the chosen nucleation temperature and $P(H_2)/P(H_2O)$ are below the metal oxide stability line, the deposited film nucleates as the metal oxide. If the chosen nucleation temperature and $P(H_2)/P(H_2O)$ are above the metal oxide stability line, the deposited film nucleates either as a metal film or as an oxygen deficient metal oxide, depending upon the kinetics of the reaction of hydrogen with the chosen metal oxide material.

For many metal oxide/semiconductor systems with favorable lattice-matching, the nucleation of a metal oxide film on the native oxide-free semiconductor surface will result in epitaxy of the metal oxide film on the semiconductor surface. In any event, the resulting metal oxide forms upon the substrate surface so that there exists substantially no native oxide interposed between the metal oxide thin film and the substrate surface.

The following are provided as exemplary methods for carrying out the steps of the present invention:

EXAMPLE #1

To deposit a thin film of (001)-oriented epitaxial thin film of $CeO_2$ upon a substrate comprised of a single crystal of germanium, Ge (001), a Ge substrate is initially cleaned to atomic cleanliness. Such cleaning steps included successive ultrasonic rinsing in trichloroethylene, acetone, and methanol, followed by rinsing in a deionized water. Any native oxide is then removed by a thirty-second dipping in a 1:10 $HF:H_2O$ solution, and the substrate is subsequently blown dry with dry nitrogen.

The cleaned Ge substrate is then mounted into the facility vacuum chamber in preparation of a pulsed laser deposition of the $CeO_2$ film. The chamber is then evacuated to a base pressure of less than $5\times10^{-6}$ Torr. Meanwhile, the ablation target (comprised of Ce and O) is cleaned in situ by laser ablation wherein a shutter is positioned between the substrate and the ablation target to prevent deposition during this target cleaning.

A flow of 4% $H_2$/96% Ar is then introduced into the chamber until the $H_2$/Ar pressure reaches 100 m Torr. This yields a hydrogen partial pressure of $4\times10^{-3}$ Torr, and a value of $P(H_2)/P(H_2O)$ of $8\times10^2$. Argon accompanies the introduced hydrogen in this example as a matter of safety, i.e. the argon/hydrogen mixture does not ignite as easily as does pure hydrogen, and argon is simply an inert carrier gas which, unlike hydrogen, has no effect on the oxide decomposition. The Ge substrate is then heated to 750° C. in 100 mTorr 4% $H_2$/96% Ar, and annealed under these conditions for about thirty minutes to reduce the likelihood of coverage of the native oxide $GeO_2$ on the substrate surface. As can be verified by the graph of FIGS. 5 and 10, for a $P(H_2)/P(H_2O)$ ratio of $8 \times 10^2$ and a Ge substrate temperature of 750° C., any formation of the (native) oxide $GeO_2$ upon the substrate surface is above the (FIG. 5) stability line and is thus thermodynamically unstable yet the formation of $CeO_2$ upon a substrate is below the (FIG. 10) $CeO_2$ stability line and is thus thermodynamically stable.

Using the pulsed laser ablation techniques, a 10 nm thick thin-film of $CeO_2$ is then deposited on the Ge surface. The specific deposition parameters suitable for such a deposition technique are 100 mTorr 4% $H_2$/96% Ar, 750° C., ablation laser is a KrF excimer laser, laser energy density is about 1.5 J/cm$^2$, laser repetition rate is 1 Hz, deposition rate is 0.1 nm/laser pulse, and the ablation target is pressed and sintered $CeO_2$.

If desired, an additional 10 nm thick thin-film of $CeO_2$ can be deposited atop the initial 10 nm film growth at 750° C. in vacuum ($2 \times 10^{-5}$ Torr background pressure; no $H_2$/Ar flow) using the pulsed laser deposition parameters set forth in the preceding paragraph. The substrate can thereafter be cooled to 300° C. in vacuum. An additional 80 nm of epitaxial $CeO_2$ can be deposited upon the substrate under the following conditions: substrate temperature$\approx$300° C., $P(O_2)=4 \times 10^{-4}$ Torr, laser energy$\approx$1.5 J/cm$^2$, deposition rate$\approx$0.1/laser pulse, and laser repetition rate$\approx$1 Hz.

Figure 12A:
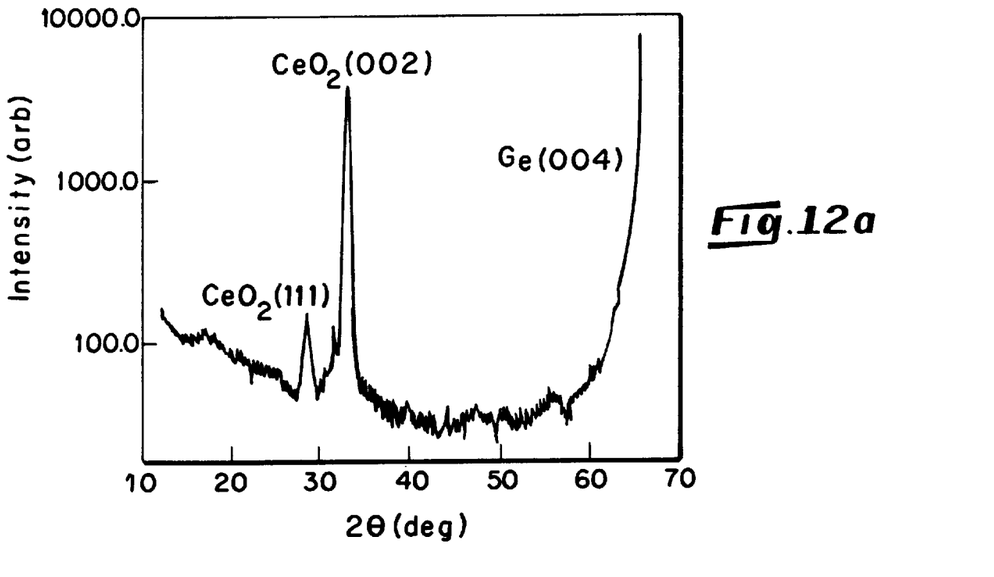
FIGS. 12a and 12b are graphs presenting X-ray diffraction data for epitaxial (001) $CeO_2$ film on (001) Ge.
Figure 12B:
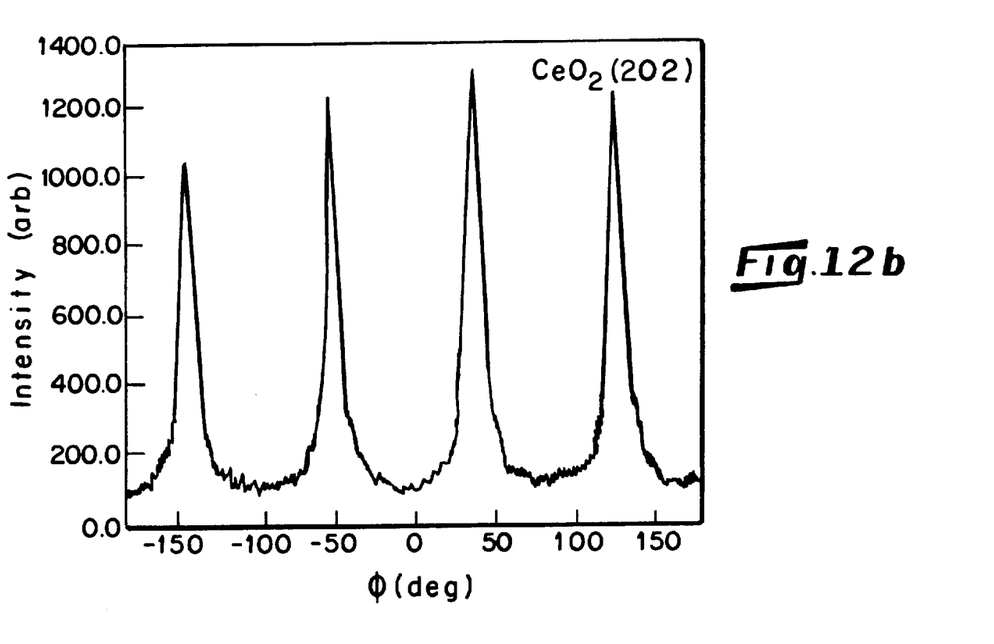

Lastly, the Ge substrate is then cooled and removed from the deposition chamber. In this regard, FIGS. 12a and 12b show the x-ray diffraction data for the $CeO_2$ film on (001) Ge. The film is predominantly epitaxial with a (001) orientation. The in-plane phi-scan shows that the film is in-plane aligned as well. The epitaxial relationship between the substrate and film indicates that the $CeO_2$/Ge interface is abrupt (or sharp) and thus free of $GeO_2$ during film nucleation. Exposure of the structure to $P(O_2)=4 \times 10^{-4}$ Torr at elevated temperature results in the formation of some $GeO_2$ at the interface due to oxygen diffusion primarily along the substrate boundaries and defects.

Using the method of this example, a specific article, namely an epitaxial (001)-oriented $CeO_2$ film on a (001) Ge surface is realized for the first time.

Figure 13:
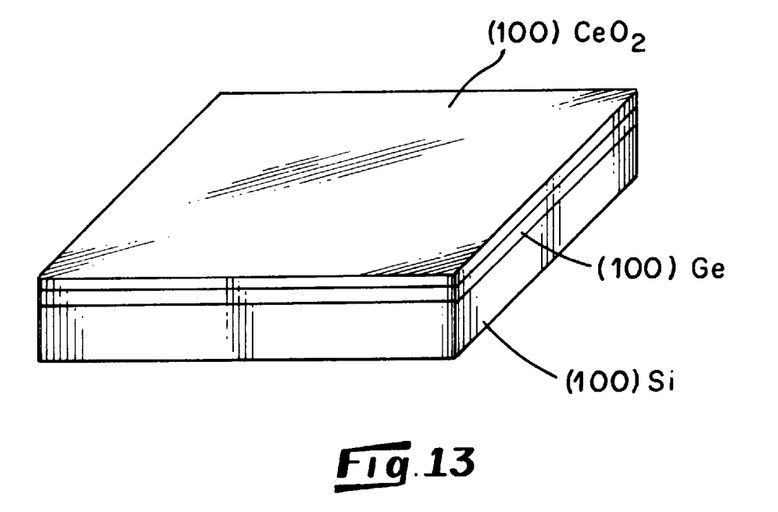
FIG. 13 is a perspective view illustrating schematically a structure comprised of epitaxial (001) $CeO_2$ overlying a Ge-coated (001) Si substrate.

As a modification of the Example 1 embodiment, the starting crystalline Ge surface could be an epitaxial Ge film on a single crystal substrate other than Ge. This would include an epitaxial Ge film on a single crystal Si, $Si_{1-x}Ge_x$, or other semiconductor materials (Group III-V's, II-VI's) surface for which the epitaxial growth of Ge has been demonstrated. For example, using the aforedescribed methods with a substrate comprising (001) Si which is overlain with a surface layer of epitaxial (001) Ge, a thin-film of epitaxial (001) $CeO_2$ can be built up upon the Ge surface to render an article distinct from the prior art consisting of epitaxial (001) $CeO_2$ on (001) Si as illustrated in FIG. 13. Accordingly, the method described herein presents a new method for growing crystalline oxides on various semiconductor surfaces.

Furthermore, the metal oxide thin-film material chosen to be deposited on the substrate surface in the Example 1 embodiment can be any oxide that is thermodynamically stable in the presence of the semiconductor at the deposition temperature. Oxides that satisfy this criterion include $Re_2O_3$ (wherein Re=Pr, La, Y, Sc, Nd, Sm, Eu, Gd, Tb, Dy, Ho, Er, Tm or Yb), $CeO_2$, $ZrO_2$, $HfO_2$, $SnO_2$, $In_2O_3$, $In_2O_3$, $K_2O$, $Ga_2O_3$, $Na_2O$, $B_2O_3$, $Al_2O_3$, MgO, SrO, CaO, BaO, BeO, titanium oxides, tantalum oxides, niobium oxides, ZnO, and compounds consisting of combinations thereof.

EXAMPLE #2

To deposit a metal oxide onto a substrate comprised of a single crystal of GaAs, the surface of the GaAs substrate is cleaned to atomic cleanliness to remove any surface contaminants and surface oxides on the substrate surface. The cleaned GaAs substrate is then loaded into a film growth vacuum chamber, and the chamber is evacuated to a base pressure below $10^{-6}$ Torr, preferably below $10^{-8}$ Torr.

Figure 3:
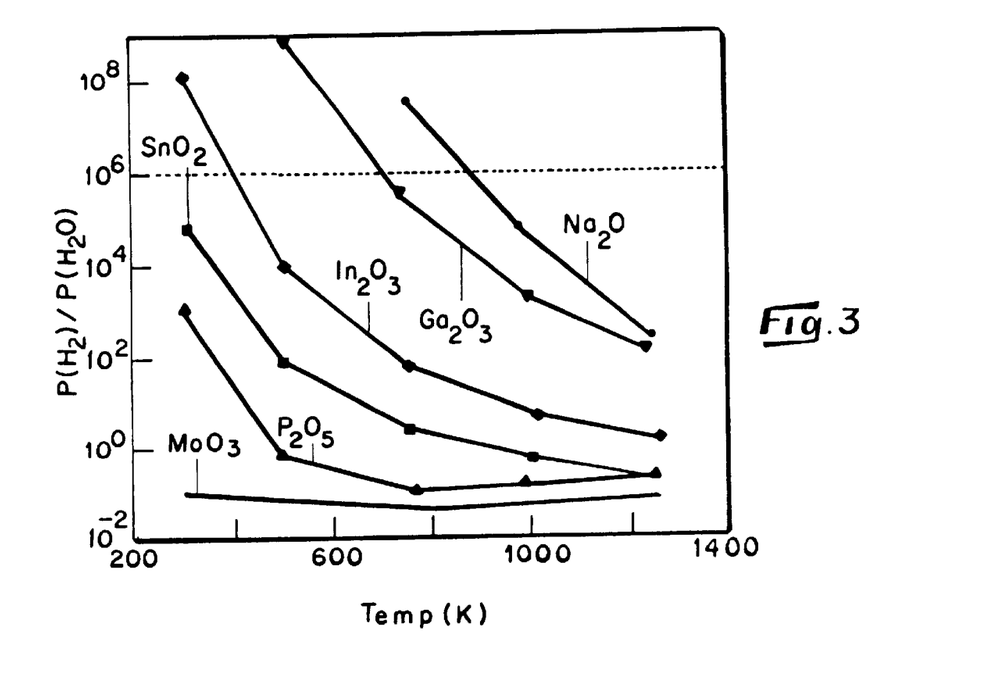
FIG. 3 is a graph on which is plotted oxide stability lines for the oxides $SnO_2$, $Na_2O$, $Ga_2O_3$, $In_2O_3$, $P_2O_5$ and $MoO_3$.
Figure 4:
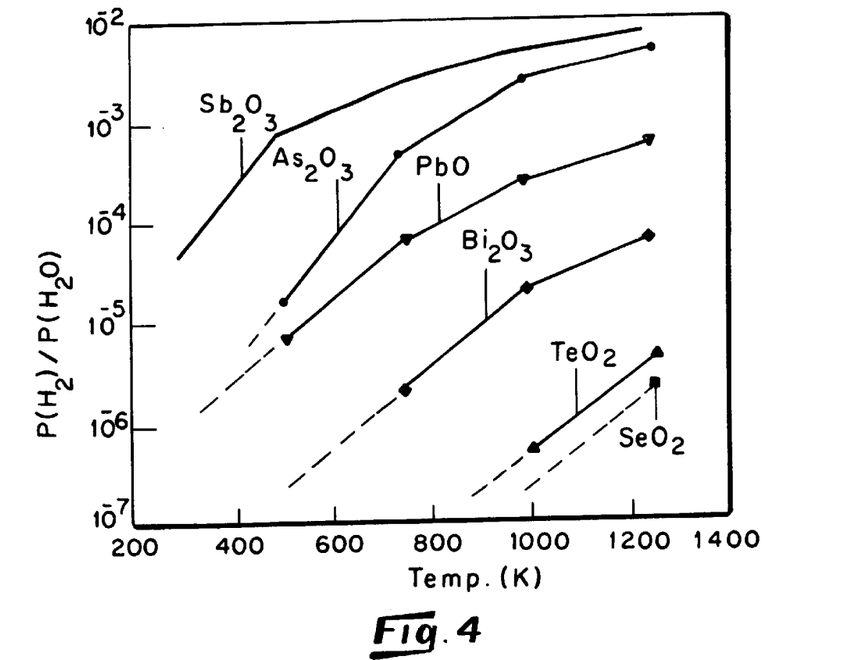
FIG. 4 is a graph on which is plotted oxide stability lines for the oxides $Sb_2O_3$, $As_2O_3$, PbO, $Bi_2O_3$, $TeO_2$ and $SeO_2$.
Figure 5:
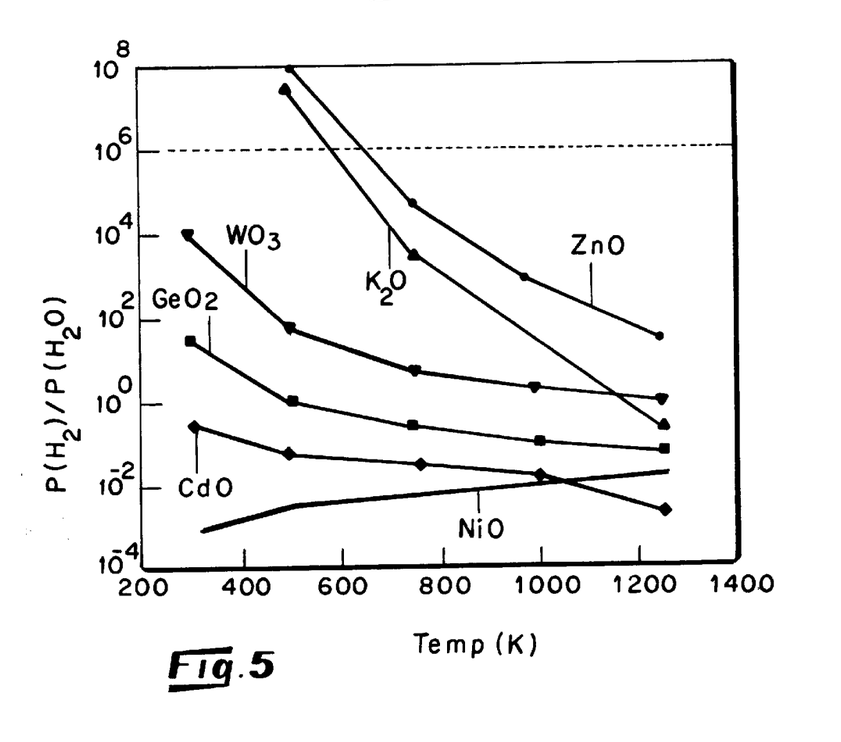
FIG. 5 is a graph on which is plotted oxide stability lines for the oxides Zno, $K_2O$, $WO_3$, $GeO_2$, CdO and NiO.
Figure 6:
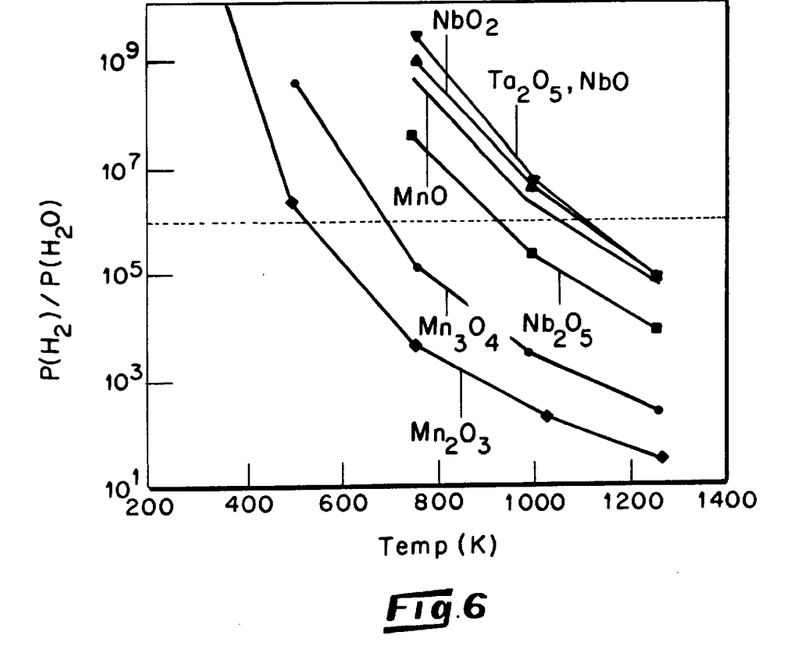
FIG. 6 is a graph on which is plotted oxide stability lines for the oxides $Mn_2O_3$, $Mn_3O_4$, $Mn_3O_4$, MnO, $Nb_2O_5$, $NbO_2$, NbO and $Ta_2O_5$.
Figure 7:
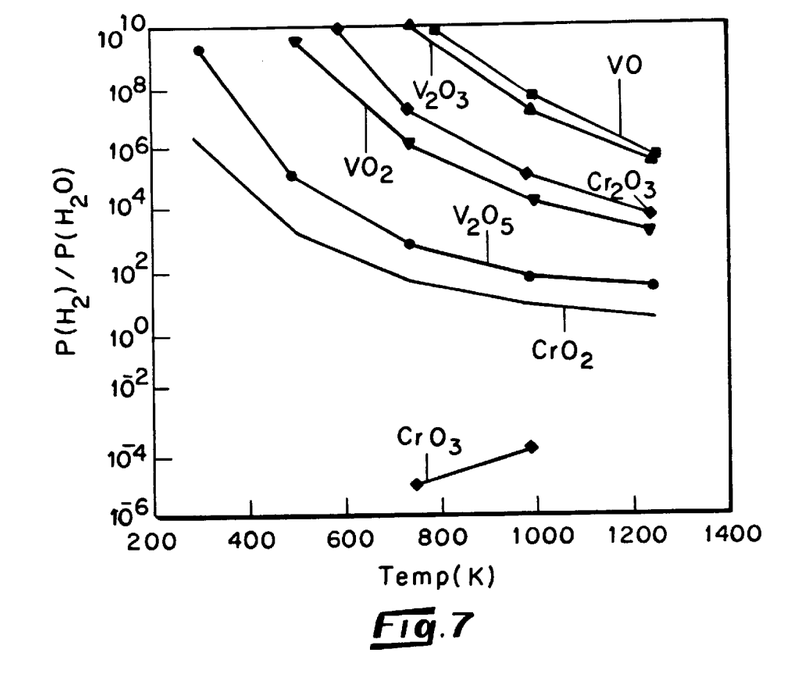
FIG. 7 is a graph on which is plotted oxide stability lines for the oxides $CrO_3$, $CrO_2$, $V_2O_5$, and VO.
Figure 8:
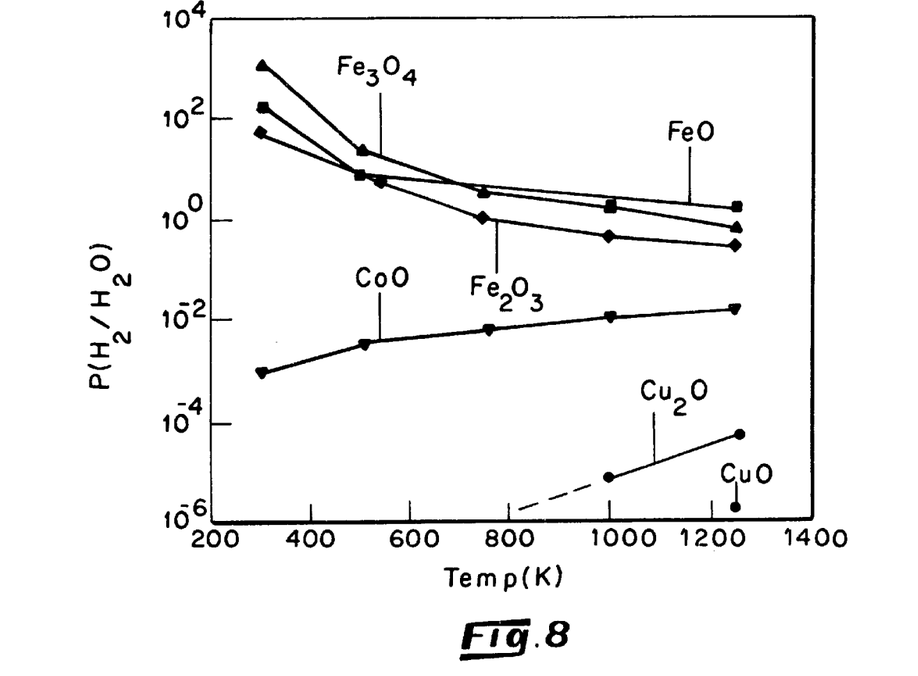
FIG. 8 is a graph on which is plotted oxide stability lines for the oxides CuO, $Cu_2O$, CoO, $Fe_2O_3$, $Fe_2O_3$, $Fe_3O_4$ and FeO.
Figure 9:
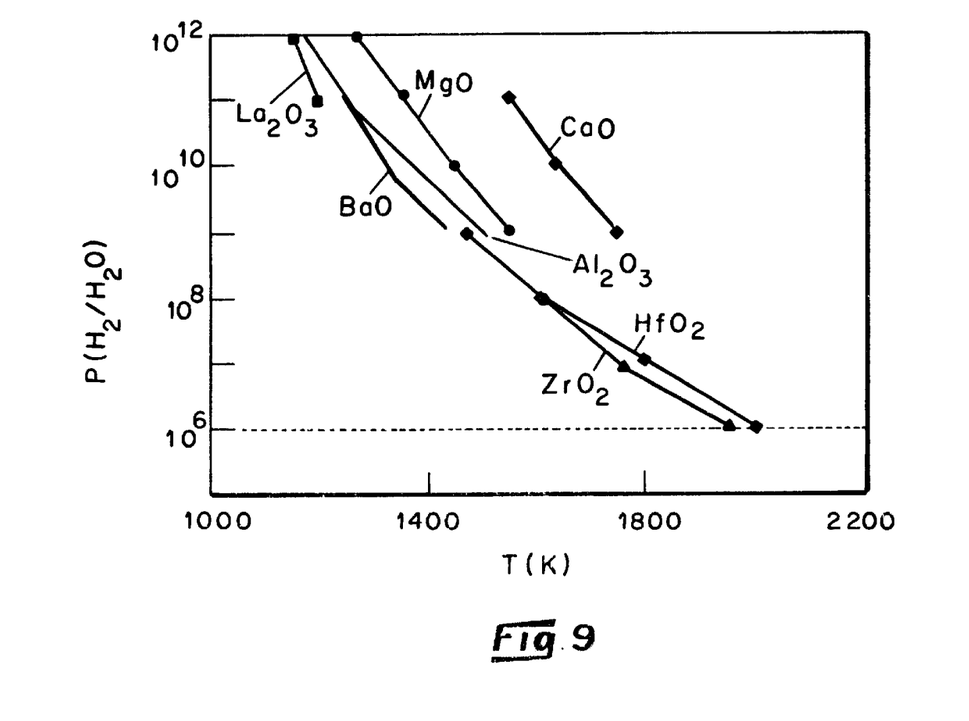
FIG. 9 is a graph on which is plotted oxide stability lines for the metal oxides $La_2O_3$, BaO, MgO, CaO, $Al_2O_3$, $HfO_2$, and $ZrO_2$.
Figure 10:
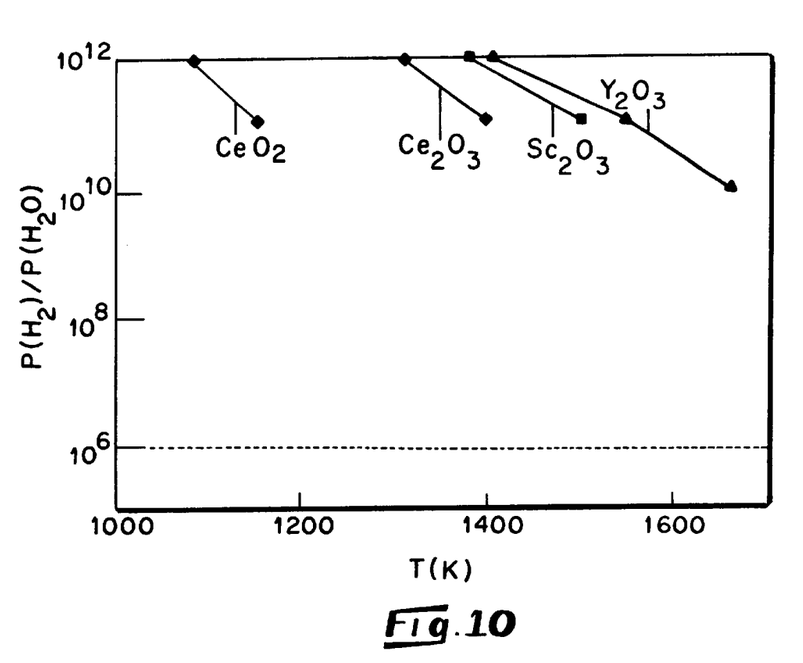
FIG. 10 is a graph on which is plotted oxide stability lines for the metal oxides $CeO_2$, $Ce_2O_3$, $Sc_2O_3$ and $Y_2O_3$.
Figure 14:
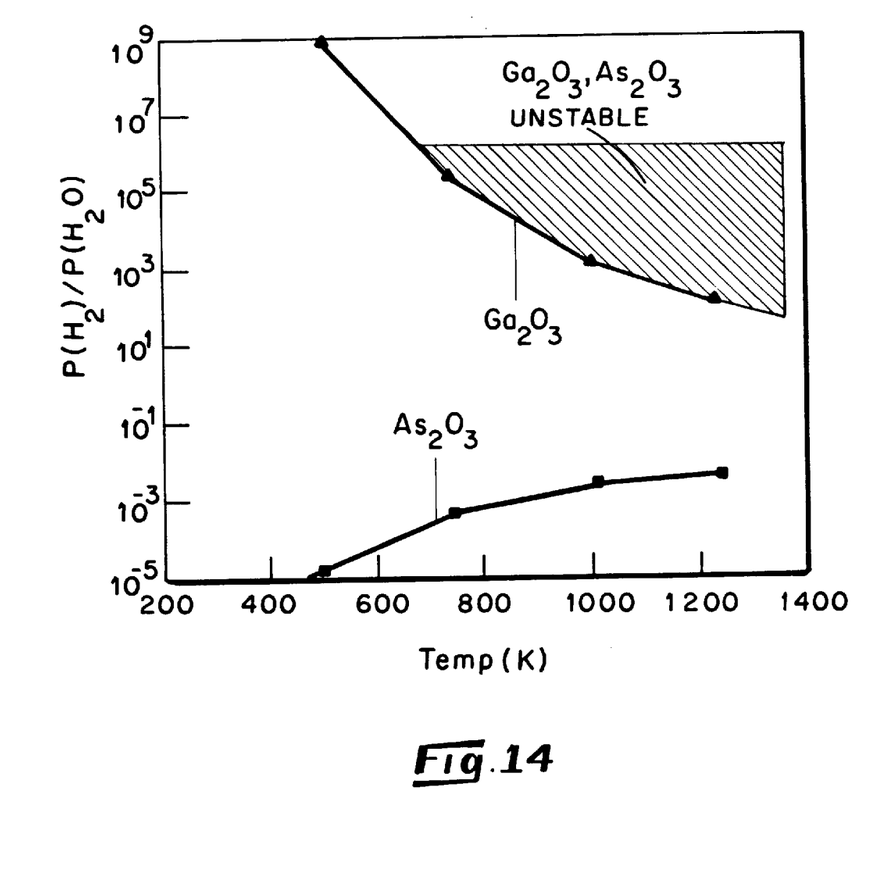
FIG. 14 is a graph on which is plotted stability lines for $Ga_2O_3$ and $As_2O_3$ with respect to the ratio of hydrogen gas to water vapor.

Since the composition of the substrate includes both Ga and As, the native oxides of Ga and As (i.e. $Ga_2O_3$ and $As_2O_3$) must be taken into account in establishing the deposition environment within the chamber. In particular, hydrogen gas is introduced into the evacuated chamber to a sufficient pressure such that the ratio of hydrogen to water vapor partial pressure $P(H_2)/P(H_2O)$ is approximately at or above the $As_2O_3$ and $Ga_2O_3$ stability lines at the anticipated oxide film growth temperature as shown in FIGS. 3 and 4, or as best shown in FIG. 14 in which the stability lines of both $As_2O_3$ and $Ga_2O_3$ are plotted on a single graph and the conditions at which both $As_2O_3$ and $Ga_2O_3$ are unstable are appropriately labeled. Depending upon the anticipated metal oxide growth temperature, FIG. 14 confirms that a value of $(P(H_2)/P(H_2O) > 3 \times 10^3$, preferably greater than $10^5$, is necessary to render the formation of both $As_2O_3$ and $Ga_2O_3$ unstable.

Meanwhile, the GaAs substrate is heated in the film growth chamber to a temperature ranging from 425° C. to 750° C., preferably between 500° C. and 600° C. As the substrate is heated, the presence of hydrogen in the growth chamber reduces the likelihood of formation of any $As_2O_3$ or $Ga_2O_3$ that resides or forms on the substrate surface, resulting in the gas-phase etching of the native oxide. The final growth temperature is consistent with the requirement that the conditions (temperature, water vapor partial pressure, hydrogen partial pressure) be above the $As_2O_3$ and $Ga_2O_3$ stability lines (as depicted in FIG. 14) where the formation of $As_2O_3$ and $Ga_2O_3$ is thermodynamically unfavored.

A metal oxide thin film material that is stable for the chosen temperature/water vapor/hydrogen conditions is then deposited onto the heated substrate in an initial thin-film by means of physical vapor deposition. This oxide material must be thermodynamically stable in contact with GaAs. In other words, this oxide should be stable against decomposition through the formation of either $As_2O_3$ or $Ga_2O_3$ at the chosen deposition conditions.

Additional film can be deposited on the initially-deposited oxide thin-film which serves as a template for subsequent thin film growth. Since the substrate/thin-film interface is formed free of native oxide during the initial deposition of metal oxide, the deposition conditions and/or materials choice for the growth of additional film do not have to coincide with the requirements of $As_2O_3$ and $Ga_2O_3$ thermodynamic instability as outlined for the template oxide layer.

It follows from the foregoing that methods have been described herein for depositing a metal oxide thin film on a semiconductor surface, wherein the deposition operation results in a sharp interface between the film and the semiconductor, with no measurable native oxide present at the semiconductor/metal oxide interface. The method involves the use of hydrogen gas to reduce or eliminate the presence of the semiconductor native oxides from the semiconductor surface during the initial nucleation of the metal oxide film using physical vapor deposition. In order to achieve elimination of the semiconductor native oxides, the hydrogen partial pressure and substrate temperature must be sufficiently high such that the native oxides are thermodynamically unstable. The oxide stability line can be estimated from the temperature-dependent Gibbs-free energy of the chosen native oxide when compared to the $H_2O/H_2$ equilibrium behavior. Again, stability lines for oxides of interest are shown in FIGS. 3–11. These curves are derived from Ellingham diagrams for oxide materials. In these plots, conditions corresponding to points above a given stability line indicate that the given oxide is not stable and will decompose.

In addition to the aforestated requirement, the Gibbs free energy of the chosen metal oxide film must be larger in magnitude than that of the semiconductor native oxide in order for it to be more favorable for the metal oxide to reside at the interface in comparison to the native oxide(s). For metal oxide/semiconductor systems with favorable lattice-matching, this invention will enable epitaxy of a metal oxide on the semiconductor surface.

This approach is generally applicable for many semiconductor substrate materials and has a significant advantage over conventional physical vapor deposition approaches in that it relaxes the vacuum requirements necessary to achieve a sharp interface between the metal oxide film and the semiconductor. Furthermore, this invention enables the integration of various epitaxial oxide materials and device structures with semiconductors by providing a crystalline oxide template for additional epitaxial oxide film growth. Additional uses for this invention include the formation of gate oxides for a metal/oxide/semiconductor field effect transistor (MOSFET) and MOS-type memory structures (e.g. DRAM) for an array of semiconductor materials. Also included would be devices based on the integration of epitaxial oxide materials that are ferroelectric, ferromagnetic, magneto-resistive, luminescent, or superconducting with semiconductors. This would include the formation of ferroelectric memory and ferroelectric field-effect transistors.

It follows from the foregoing that numerous modifications and substitutions can be had to the aforedescribed embodiments without departing from the spirit of the invention. Accordingly, the aforedescribed embodiments are intended for the purpose of illustration and not as limitation.

What is claimed is:

1. A process for growing a metal oxide thin film upon a semiconductor surface with a physical vapor deposition technique wherein constituent atoms of the metal oxide to be deposited upon the semiconductor surface are moved toward the semiconductor surface in a controlled environment, the process comprising the steps of:

developing an ultra-high vacuum environment about the semiconductor surface which has been cleaned to atomic cleanliness and wherein the primary vapor constituent of the high-vacuum environment is water;

heating the semiconductor surface to an elevated temperature and introducing hydrogen gas into the high-vacuum environment so that the surface temperature and the ratio of hydrogen pressure to water pressure at the semiconductor surface are high enough to render the formation of native oxides on the semiconductor surface thermodynamically unstable yet are not so high that the formation of the desired metal oxide on the semiconductor surface is thermodynamically unstable;

directing constituent atoms of the metal oxide to be deposited upon the semiconductor surface toward the semiconductor surface by a physical vapor deposition technique so that the atoms come to rest upon the semiconductor surface as a thin film of metal oxide so that there exists substantially no native oxide at the semiconductor surface/thin film interface.

2. The process as defined in claim 1 wherein the semiconductor surface is comprised of a material or a combination of materials from a group consisting of: In, Sn, P, Mo, Sb, As, Bi, Pb, Te, Se, W, Ge, Cd, Ni, Fe, Co, Cu, Ag, Pt, Hg, Ir, Os, S, Ga, K, Zn, Na, Nb, Mn, Ta, Cr and V.

3. The process as defined in claim 2 wherein the semiconductor surface is comprised of a material or a combination of materials from a group consisting of: In, Sn, P, Mo, Sb, As, Bi, Pb, Te, Se, W, Ge, Cd, Ni, Fe, Co, Cu, Ag, Pt, Hg, Ir, Os and S.

4. The process as defined in claim 1 wherein the metal oxide deposited upon the semiconductor surface in the directing step is comprised of a material from a group consisting of: $Re_2O_3$ (wherein Re=Pr, La, Y, Sc, Nd, Sm, Eu, Gd, Tb, Dy, Ho, Er, Tm or Yb), $CeO_2$, $ZrO_2$, $HfO_2$, $SnO_2$, $In_2O_3$, $In_2O_3$, $K_2O$, $Ga_2O_3$, $Na_2O$, $B_2O_3$, $Al_2O_3$, MgO, SrO, CaO, BaO, BeO, titanium oxides, tantalum oxides, niobium oxides, ZnO, and compounds consisting of combinations of said materials.

5. The process as defined in claim 1 wherein the base pressure developed in the vacuum environment during the developing step is greater than about $10^{-2}$ Torr.

6. The process as defined in claim 1 wherein the base pressure developed in the vacuum environment during the developing step is greater than about $10^{-4}$ Torr.

7. The process as defined in claim 1 wherein the base pressure developed in the vacuum environment during the developing step is greater than about $10^{-6}$ Torr.

8. The process as defined in claim 1 wherein the base pressure developed in the vacuum environment during the developing step is greater than about $10^{-8}$ Torr.

9. The process as defined in claim 1 wherein the step of directing is effected by pulsed-laser deposition.

10. A process for growing a metal oxide thin film upon the surface of a semiconductor with a physical vapor deposition technique wherein constituent atoms of the metal oxide to be deposited upon the semiconductor surface are moved toward the surface of the semiconductor in a controlled environment, the process comprising the steps of:

selecting a metal oxide to be deposited upon the surface of the semiconductor by a physical vapor deposition technique under conditions which render the formation of metal oxide upon the semiconductor surface thermodynamically stable yet render the formation of native oxides upon the semiconductor surface thermodynamically unstable;

developing an ultra-high vacuum environment about a semiconductor surface which has been cleaned to atomic cleanliness and wherein the primary vapor constituent of the high-vacuum environment is water;

establishing conditions at the semiconductor surface which render the formation of metal oxide upon the semiconductor surface thermodynamically stable yet render the formation of native oxides upon the semiconductor surface thermodynamically unstable including the steps of heating the semiconductor surface to an elevated temperature and introducing hydrogen gas into the high-vacuum environment so that the surface temperature and the ratio of hydrogen pressure to water pressure at the semiconductor surface are high enough to render the formation of native oxides on the semiconductor surface thermodynamically unstable yet are not so high that the formation of the desired metal oxide on the semiconductor surface is thermodynamically unstable; and directing constituent atoms of the metal oxide to be deposited upon the semiconductor surface toward the surface of the semiconductor by a physical vapor deposition technique so that the atoms come to rest upon the semiconductor surface as a predominately epitaxial thin film of metal oxide so that there exists substantially no native oxide at the semiconductor surface/thin film interface.

11. The process as defined in claim 10 wherein the semiconductor surface is comprised of a material or a combination of materials from a group consisting of: In, Sn, P, Mo, Sb, As, Bi, Pb, Te, Se, W, Ge, Cd, Ni, Fe, Co, Cu, Ag, Pt, Hg, Ir, Os, S, Ga, K, Zn, Na, Nb, Mn, Ta, Cr and V.

12. The process as defined in claim 11 wherein the semiconductor surface is comprised of a material or a combination of materials from a group consisting of: In, Sn, P, Mo, Sb, As, Bi, Pb, Te, Se, W, Ge, Cd, Ni, Fe, Co, Cu, Ag, Pt, Hg, Ir, Os and S.

13. The process as defined in claim 10 wherein the metal oxide deposited upon the semiconductor surface in the directing step is comprised of one material from a group consisting of: $Re_2O_3$ (wherein Re=Pr, La, Y, Sc, Nd, Sm, Eu, Gd, Tb, Dy, Ho, Er, Tm or Yb), $CeO_2$, $ZrO_2$, $HfO_2$, $SnO_2$, $In_2O_3$, $In_2O_3$, $K_2O$, $Ga_2O_3$, $Na_2O$, $B_2O_3$, $Al_2O_3$, MgO, SrO, CaO, BaO, BeO, titanium oxides, tantalum oxides, niobium oxides, ZnO, and compounds consisting of combinations of said materials.

14. The process as defined in claim 10 wherein the base pressure developed in the vacuum environment during the developing step is greater than about $10^{-2}$ Torr.

15. The process as defined in claim 10 wherein the base pressure developed in the vacuum environment during the developing step is greater than about $10^{-4}$ Torr.

16. The process as defined in claim 10 wherein the base pressure developed in the vacuum environment during the developing step is greater than about $10^{-6}$ Torr.

17. The process as defined in claim 10 wherein the base pressure developed in the vacuum environment during the developing step is greater than about $10^{-8}$ Torr.

18. The process as defined in claim 11 wherein the step of directing is effected by pulsed-laser deposition.

19. A process for growing a metal oxide thin film upon the surface of germanium (Ge) with a physical vapor deposition technique wherein constituent atoms of the metal oxide to be deposited upon the Ge surface are moved toward the surface of the Ge surface in a controlled environment, the process comprising the steps of:

developing an ultra-high vacuum environment about a Ge surface which has been cleaned to atomic cleanliness wherein the vacuum base pressure developed during this developing step is no greater than $10^{-3}$ Torr and wherein the primary vapor constituent of the high-vacuum environment is water;

heating the Ge surface to a temperature ranging from between 200° C. and 850° C. and introducing hydrogen gas into the high-vacuum environment so that the surface temperature and the ratio of hydrogen pressure to water pressure at the Ge surface are high enough to render the formation of native oxides on the Ge surface thermodynamically unstable yet are not so high that the formation of the desired metal oxide on the Ge surface is thermodynamically unstable;

directing constituent atoms of the metal oxide to be deposited upon the Ge surface toward the Ge surface by a physical vapor deposition technique so that the atoms come to rest upon the Ge surface as a thin film of metal oxide so that there exists substantially no native oxide at the Ge surface/thin film interface.

20. The process as defined in claim 19 wherein the step of directing is effected by pulsed-laser deposition.

21. The process as defined in claim 19 wherein the metal oxide deposited upon the Ge surface in the directing step is comprised of one material from a group consisting of: $Re_2O_3$ (wherein Re=Pr, La, Y, Sc, Nd, Sm, Eu, Gd, Tb, Dy, Ho, Er, Tm or Yb), $CeO_2$, $ZrO_2$, $HfO_2$, $SnO_2$, $In_2O_3$, $In_2O_3$, $K_2O$, $Ga_2O_3$, $Na_2O$, $B_2O_3$, $Al_2O_3$, MgO, SrO, CaO, BaO, BeO, titanium oxides, tantalum oxides, niobium oxides, ZnO, and compounds consisting of combinations of said materials.

* * * * *